US006908845B2

(12) United States Patent
Swan et al.

(10) Patent No.: US 6,908,845 B2
(45) Date of Patent: Jun. 21, 2005

(54) INTEGRATED CIRCUIT DIE AND AN ELECTRONIC ASSEMBLY HAVING A THREE-DIMENSIONAL INTERCONNECTION SCHEME

(75) Inventors: Johanna M. Swan, Scottsdale, AZ (US); Ravi V. Mahajan, Tempe, AZ (US); Bala Natarajan, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 219 days.

(21) Appl. No.: 10/113,148

(22) Filed: Mar. 28, 2002

(65) Prior Publication Data

US 2003/0186486 A1 Oct. 2, 2003

(51) Int. Cl.⁷ .......................... H01L 21/44; H01L 21/30; H01L 21/46
(52) U.S. Cl. ................... 438/622; 438/106; 438/107; 438/455; 438/458; 438/464
(58) Field of Search ..................... 438/622, 106–109, 438/455–458, 464

(56) References Cited

U.S. PATENT DOCUMENTS

| | | |
|---|---|---|
| 3,323,198 A | 6/1967 | Shortes |
| 3,484,341 A | 12/1969 | Devitt |
| 3,562,009 A | 2/1971 | Cranston et al. |
| 3,648,131 A | 3/1972 | Stuby |

(Continued)

FOREIGN PATENT DOCUMENTS

| | | |
|---|---|---|
| EP | 0 698 288 B1 | 2/1996 |
| EP | 0 757 431 A2 | 2/1997 |
| JP | 59-15595 | 9/1984 |
| JP | 6-302954 | 10/1994 |
| WO | WO 92/03848 | 3/1992 |
| WO | WO 94/09513 | 4/1994 |
| WO | WO 94/25981 | 11/1994 |
| WO | WO 96/21943 | 7/1996 |
| WO | WO 97/45856 | 12/1997 |
| WO | WO 97/45862 | 12/1997 |

OTHER PUBLICATIONS

Anthony, Thomas R., "Forming Feedthroughs in Laser–Drilled Holes in Semiconductor Wafers by Double–Sided Sputtering," *IEEE Trans. On Comp., Hybrids, & Mfg. Tech.*, Mar. 1982, pp. 171–180, vol. CHMT–5, No. 1.

AZ Corporation, "Plasma Jet Etching Technology and Equipment; Silicon Wafer Thinning and Isotropical Etching at Atmospheric Pressure," Semicon/Europe, Apr. 1995, 4 pages, Geneva Switzerland.

(Continued)

*Primary Examiner*—Thanh Nguyen
(74) *Attorney, Agent, or Firm*—Blakely, Sokoloff, Taylor & Zafman LLP

(57) ABSTRACT

The opening is initially fabricated in an upper surface of a wafer substrate, which allows for the use of alignment features on the upper surface of the wafer substrate. The openings are then filled with plugs. An integrated circuit is then manufactured over the upper surface of the substrate and the plugs. The plugs are located below the integrated circuit and do not take up "real estate" reserved for metal layers of the integrated circuit. A carrier is then bonded to an upper surface of the integrated circuit, whereafter a lower portion of the wafer substrate is removed in a grinding and etching operation. The plugs are then removed through a lower surface of the wafer substrate, whereafter the openings are filled with conductive members in a plating operation. A metal redistribution layer can be formed on a lower surface of the wafer substrate, because the carrier provides sufficient rigidity.

34 Claims, 4 Drawing Sheets

U.S. PATENT DOCUMENTS

| | | |
|---|---|---|
| 3,810,129 A | 5/1974 | Behman et al. |
| 3,811,117 A | 5/1974 | Anderson, Jr. et al. |
| 3,881,884 A | 5/1975 | Cook et al. |
| 3,993,917 A | 11/1976 | Kalter |
| 4,016,644 A | 4/1977 | Kurtz |
| 4,023,562 A | 5/1977 | Hynecek et al. |
| 4,079,508 A | 3/1978 | Nunn |
| 4,089,992 A | 5/1978 | Doo et al. |
| 4,153,998 A | 5/1979 | McMurtry |
| 4,188,258 A | 2/1980 | Mounteer et al. |
| 4,205,556 A | 6/1980 | Runyan |
| 4,211,603 A | 7/1980 | Reed |
| 4,276,533 A | 6/1981 | Tominaga et al. |
| 4,291,293 A | 9/1981 | Yamada et al. |
| 4,348,253 A | 9/1982 | Subbarao et al. |
| 4,368,106 A | 1/1983 | Anthony |
| 4,394,712 A | 7/1983 | Anthony |
| 4,403,241 A | 9/1983 | Butherus et al. |
| 4,426,767 A | 1/1984 | Swanson et al. |
| 4,463,336 A | 7/1984 | Black et al. |
| 4,467,518 A | 8/1984 | Bansal et al. |
| 4,467,521 A | 8/1984 | Spooner et al. |
| 4,512,829 A | 4/1985 | Ohta et al. |
| 4,545,610 A | 10/1985 | Lakritz et al. |
| 4,603,341 A | 7/1986 | Bertin et al. |
| 4,628,174 A | 12/1986 | Anthony |
| 4,722,130 A | 2/1988 | Kimura et al. |
| 4,769,738 A | 9/1988 | Nakamura et al. |
| 4,807,021 A | 2/1989 | Okumura |
| 4,842,699 A | 6/1989 | Hua et al. |
| 4,897,708 A | 1/1990 | Clements |
| 4,954,458 A | 9/1990 | Reid |
| 4,978,639 A | 12/1990 | Hua et al. |
| 4,996,587 A | 2/1991 | Hinrichsmeyer et al. |
| 5,071,792 A | 12/1991 | VanVonno et al. |
| 5,160,987 A | 11/1992 | Pricer et al. |
| 5,166,097 A | 11/1992 | Tanielian |
| 5,191,405 A | 3/1993 | Tomita et al. |
| 5,200,810 A | 4/1993 | Wojnarowski et al. |
| 5,225,771 A | 7/1993 | Leedy |
| 5,270,261 A * | 12/1993 | Bertin et al. ............... 438/109 |
| 5,307,942 A | 5/1994 | Quelfeter et al. |
| 5,309,318 A | 5/1994 | Beilstein, Jr. et al. |
| 5,313,097 A | 5/1994 | Haj-Ali-Ahmadi et al. |
| 5,314,844 A | 5/1994 | Imamura |
| 5,322,816 A | 6/1994 | Pinter |
| 5,323,035 A | 6/1994 | Leedy |
| 5,340,771 A | 8/1994 | Rostoker |
| 5,355,283 A | 10/1994 | Marrs et al. |
| 5,357,672 A | 10/1994 | Newman |
| 5,380,681 A | 1/1995 | Hsu |
| 5,399,898 A | 3/1995 | Rostoker |
| 5,414,637 A | 5/1995 | Bertin et al. |
| 5,426,566 A | 6/1995 | Beilstein, Jr. et al. |
| 5,432,677 A | 7/1995 | Mowatt et al. |
| 5,453,404 A | 9/1995 | Leedy |
| 5,463,246 A | 10/1995 | Matsunami |
| 5,466,634 A | 11/1995 | Beilstein, Jr. et al. |
| 5,467,305 A | 11/1995 | Bertin et al. |
| 5,468,663 A | 11/1995 | Bertin et al. |
| 5,468,999 A | 11/1995 | Lin et al. |
| 5,478,781 A | 12/1995 | Bertin et al. |
| 5,489,554 A | 2/1996 | Gates |
| 5,494,832 A | 2/1996 | Lehmann et al. |
| 5,502,333 A | 3/1996 | Bertin et al. |
| 5,502,667 A | 3/1996 | Bertin et al. |
| 5,502,893 A | 4/1996 | Endoh et al. |
| 5,506,753 A | 4/1996 | Bertin et al. |
| 5,517,057 A | 5/1996 | Beilstein, Jr. et al. |
| 5,517,754 A | 5/1996 | Beilstein, Jr. et al. |
| 5,532,519 A | 7/1996 | Bertin et al. |
| 5,550,942 A | 8/1996 | Sheem |
| 5,557,844 A | 9/1996 | Bhatt et al. |
| 5,561,622 A | 10/1996 | Bertin et al. |
| 5,563,086 A | 10/1996 | Bertin et al. |
| 5,567,653 A | 10/1996 | Bertin et al. |
| 5,567,654 A | 10/1996 | Beilstein, Jr. et al. |
| 5,571,754 A | 11/1996 | Bertin et al. |
| 5,596,226 A | 1/1997 | Beilstein, Jr. et al. |
| 5,615,477 A | 4/1997 | Sweitzer |
| 5,646,067 A * | 7/1997 | Gaul ........................ 438/458 |
| 5,654,127 A | 8/1997 | Leedy |
| 5,761,802 A | 6/1998 | Grigas |
| 5,843,844 A | 12/1998 | Miyanaga |
| 5,998,292 A | 12/1999 | Black et al. |
| 6,052,287 A | 4/2000 | Palmer et al. |
| 6,184,060 B1 | 2/2001 | Siniaguine |
| 6,223,432 B1 | 5/2001 | Dennison et al. |
| 6,260,266 B1 | 7/2001 | Tamaki |
| 6,314,641 B1 | 11/2001 | Akram |
| 6,353,189 B1 | 3/2002 | Shimada et al. |
| 6,407,341 B1 | 6/2002 | Anstrom et al. |
| 6,444,576 B1 | 9/2002 | Kong |
| 2003/0155247 A1 | 8/2003 | Miura et al. |

OTHER PUBLICATIONS

Christenson, C., et al., "Wafer Through–Hole Interconnections with High Vertical Wiring Densities," *IEEE Trans. On Comp., Pkg. & Mfg. Tech.*, Dec. 1996, pp. 516–521, vol. 19, No. 4, Part A.

IPEC Precision brochure for PACEJET II (© 1996), 2 pages.

Siniaguine, Oleg, "Plasma Jet Etching at Atmospheric Pressure for Semiconductor Production, " First International Symposium on Plasma Process–Induced Damage, May 13–14, 1996, Santa Clara, California, pp. 151–153.

Siniaguine, O., et al., "Plasma Processing of Silicon Wafers at Atmospheric Pressure," *Electronic Industry*, Jun. 1994, pp. 27–30 (not translated).

\* cited by examiner

INTEGRATED CIRCUIT DIE AND AN ELECTRONIC ASSEMBLY HAVING A THREE-DIMENSIONAL INTERCONNECTION SCHEME

BACKGROUND OF THE INVENTION

1). Field of the Invention

This invention relates to an electronic assembly of the kind having a plurality of integrated circuit dies stacked onto one another, and its manufacture.

2). Discussion of Related Art

In conventional computer assemblies, integrated circuits are "two-dimensionally" connected to one another. Two dies may, for example, be mounted to a common substrate having metal lines that interconnect the integrated circuits of the dies with one another. A "three-dimensional" interconnection scheme may in certain instances be more desirable. Handheld devices may, for example, require a more compact packaging arrangement. In other applications, the metal lines in substrates may inhibit performance. Other applications may also require a three-dimensional interconnection scheme to allow for the design of more sophisticated, three-dimensional logic.

Some techniques for forming contacts on a substrate side of a die are disclosed in U.S. Pat. No. 6,184,060. These techniques are in some respects undesirable, because they require the formation of conductive members that take up metallization real estate.

BRIEF DESCRIPTION OF THE DRAWINGS

The invention is described by way of example with reference to the accompanying drawings, wherein.

DETAILED DESCRIPTION OF THE INVENTION

The following description relates to the construction of an electronic assembly by stacking two or more integrated circuit dies on top of one another. An opening is formed in a lower surface of a die and subsequently filled with a conductive member. The conductive member is located on a lower die, and interconnects integrated circuits of the upper and lower dies.

The opening is initially fabricated in an upper surface of a wafer substrate, which allows for the use of alignment features on the upper surface of the wafer substrate. The openings are then filled with plugs. An integrated circuit is then manufactured over the upper surface of the substrate and the plugs. The plugs are located below the integrated circuit and do not take up "real estate" reserved for metal layers of the integrated circuit. A carrier is then bonded to an upper surface of the integrated circuit, whereafter a lower portion of the wafer substrate is removed in a grinding and etching operation. The plugs are then removed through a lower surface of the wafer substrate, whereafter the openings are filled with conductive members in a plating operation. A metal redistribution layer can be formed on a lower surface of the wafer substrate, because the carrier provides sufficient rigidity.

Figure 1:
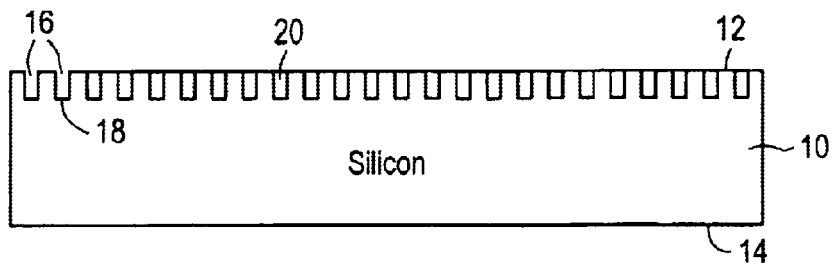
FIG. 1 is a cross-sectional side view through a wafer illustrating openings that are formed in an upper surface thereof, and plugs that are formed in the openings.

FIG. 1 illustrates a portion of a silicon wafer substrate 10 having an upper surface 12 and a lower surface 14. Openings 16 are formed in the upper surface 12. Prior to forming the openings 16, a mask is formed on the upper surface 12, and patterned utilizing known photolithographic techniques. The openings 16 are then etched through openings in the mask. All the openings 16 are simultaneously etched in the upper surface 12, utilizing an anisotropic etchant. Each opening 16 has a lower end 18 terminating within the wafer substrate 10 below the surface 12.

A respective plug 20 is then formed in each opening 16. The plugs 20 are typically oxide plugs that are grown within the openings 16 until the openings 16 are completely filled with the oxide. The oxide plugs 20 grow simultaneously in all of the openings 16.

Figure 2:
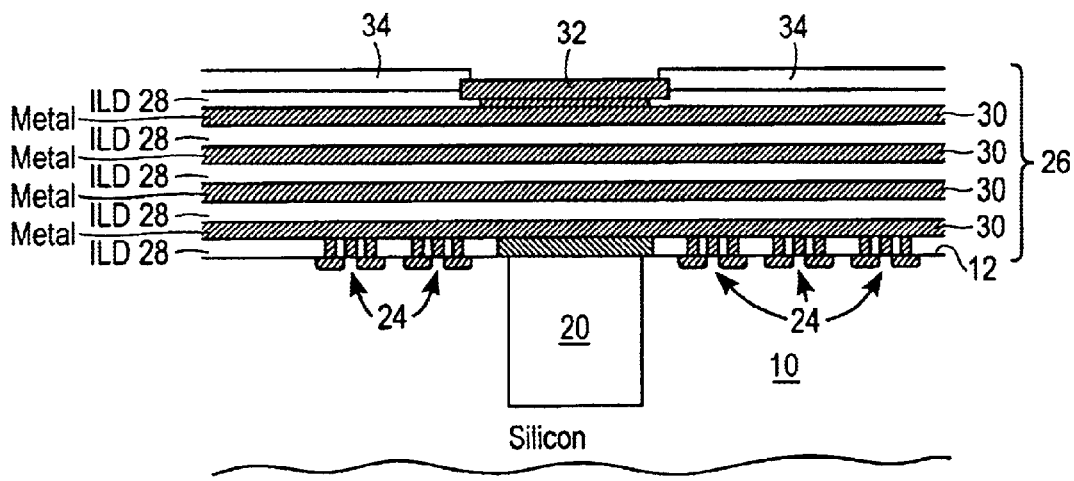
FIG. 2 is a cross-sectional view illustrating one of the plugs in more detail, and also illustrating an integrated circuit that is formed on the wafer.

As illustrated in FIG. 2, individual transistors 24 and other electronic components are formed in and on the upper surface 12. An integrated circuit 26 is also manufactured on the upper surface 12. The integrated circuit 26 has alternating dielectric layers 28 and metallization layers 30 formed on top of the upper surface 12. A contact pad 32 and a passivation layer 34 are formed on top of the final dielectric layer 28. The passivation layer 34 has a periphery that seals with the contact pad 32 and through which an upper surface of the contact pad 32 is exposed.

The contact pad 32 is connected through portions of the metallization layers 30, plugs (not shown), and vias (not shown), to the transistors 24. Signals can thus be transmitted between the transistors 24 and the contact pad 32. Although only one contact pad 32 is shown, it should be understood that there are many contact pads located in an array. What should be noted is that the plug 20 does not take up any real estate reserved for the metallization layers 30.

Figure 3:
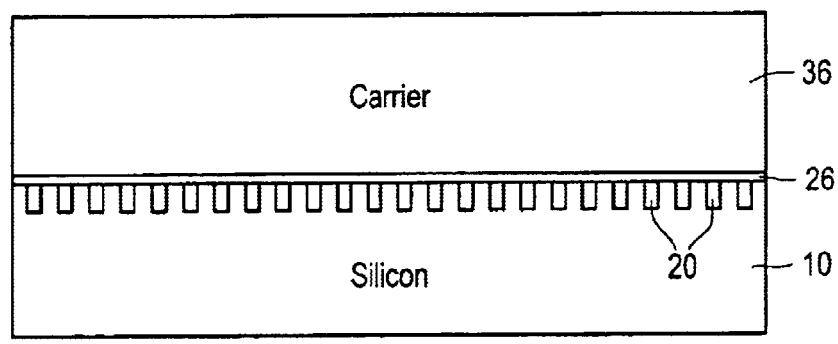
FIG. 3 is a view similar to FIG. 1 after the integrated circuit is manufactured and a carrier is bonded to an upper surface of the integrated circuit.

As illustrated in FIG. 3, a carrier 36 is subsequently bonded to an upper surface of the integrated circuit 26. The integrated circuit 26 and the wafer substrate 10 can now be carried by holding onto the carrier 36.

Figure 4:
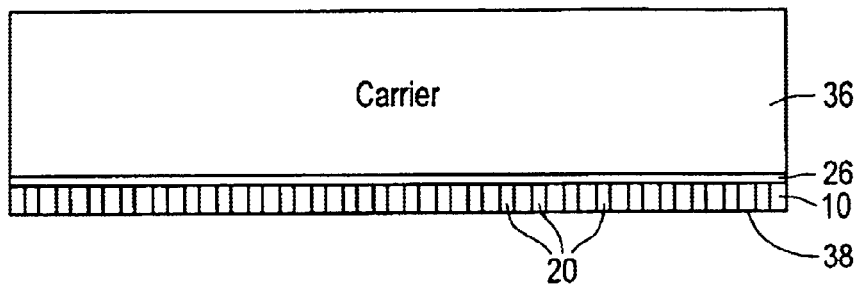
FIG. 4 is a view similar to FIG. 3 after a grinding operation and an etching operation to expose lower ends of the plugs.

FIG. 4 illustrates the assembly of FIG. 3 after a grinding and etching operation to remove a lower portion of the wafer substrate 10. The grinding and etching operations remove a sacrificial lower portion of the wafer substrate 10. The only portions of the wafer substrate 10 that remain are the portions between the plugs 20. Grinding is thus continued until lower ends of the plugs 20 are exposed in a lower surface 38 of the wafer substrate 10. The wafer substrate 10 is typically between 100 and 150 microns thick after the grinding operation. It might also be possible to grind the wafer substrate 10 down to approximately 75 microns. The lower surface 38 is subsequently exposed to an etchant which cleans the lower ends of the plugs 20.

Figure 5:
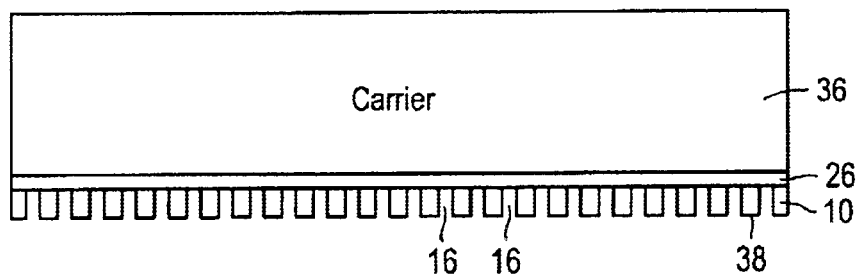
FIG. 5 is a view similar to FIG. 4 after the plugs are removed, so that the openings are again opened up.

FIG. 5 illustrates the assembly of FIG. 4 after a further etch to remove the plugs 20 through the lower surface 38. An etchant is used that selectively removes the oxide material of the plugs 20 over the silicon material of the wafer substrate 10. Etching is continued until the entire internal volume of each opening 16 are exposed in the lower surface 38 of the wafer substrate 10.

Figure 6:
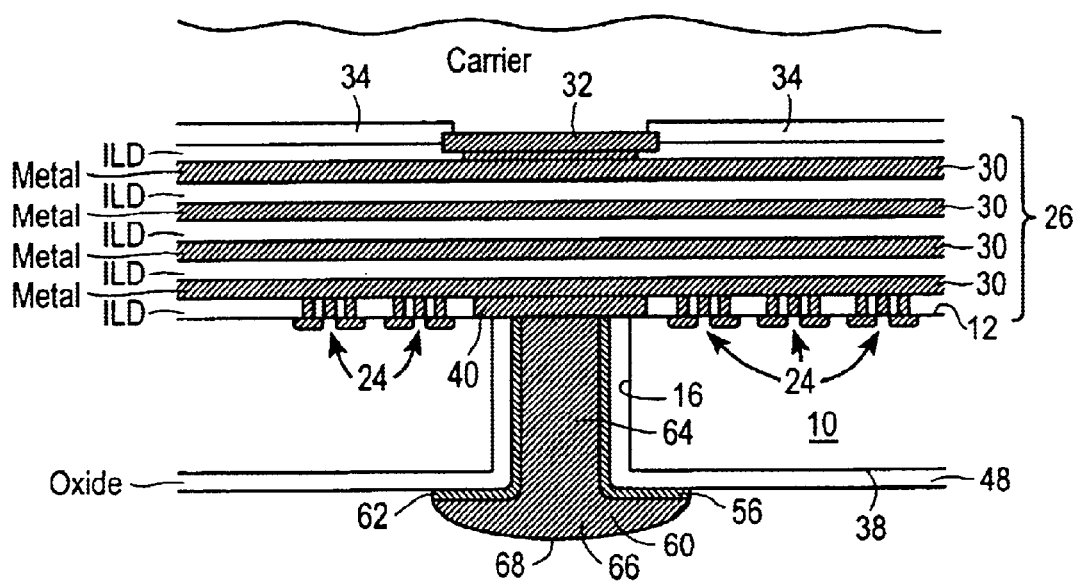
FIG. 6 is a cross-sectional side view illustrating in enlarged detail the formation of a conductive member in one of the openings.

Referring to FIG. 6, the integrated circuit 26 has a contact terminal 40 located on the upper surface 12. A lower surface of the contact terminal 40 is exposed in the opening 16 after the etch of FIG. 5. An oxide layer 48 is grown on a lower surface of the wafer substrate 10. The oxide layer 48 grows so that it covers the lower surface 38 and side surfaces of the opening 16.

A tantalum nitride layer 56 is subsequently blanket-deposited on the oxide layer 48. The tantalum nitride layer 56 forms on side surfaces of the opening 16, and on a lower surface of the oxide layer 48. The oxide layer 48 provides a surface onto which the tantalum nitride layer 56 can easily be sputtered, and also provides electrical insulation between the tantalum nitride layer 56 and the surrounding silicon. Techniques exist in the art for sputtering tantalum nitride on oxide within openings such as the openings 16.

The tantalum nitride layer 56 is patterned, and a copper conductive member 60 is formed. The tantalum nitride layer 56 is patterned by forming a mask over portions of the tantalum nitride layer 56 within the opening 16, and also over a circular portion thereof surrounding the opening 16 on a lower surface of the oxide layer 48. Other portions of the tantalum nitride layer 56 are removed, whereafter the mask is removed. The tantalum nitride layer 56 forms a circular contact pad 62 on a lower surface of the oxide layer 48.

The copper conductive member 60 is plated on the remaining tantalum nitride layer 56. The tantalum nitride layer 56 acts as a seed layer for forming the conductive member 60. The tantalum nitride layer 56 also acts as a barrier layer, preventing migration of copper from the conductive member 60 into the silicon of the wafer substrate 10.

Plating is continued until the opening 16 is filled with a portion 64 of the conductive member 60, and until the conductive member 60 forms a bump 66 on the contact pad 62. The portion 64 forms a via extending all the way through the wafer substrate 10, and has an upper end in contact with the contact terminal 40. The bump 66 has a lower surface 68 standing proud of the lower surface of the oxide layer 48.

A redistribution layer may subsequently be plated or printed on a lower surface of the oxide layer 48. The redistribution layer may have portions in contact with the bumps 66 and have a contact pad at another location, on which a bump can be screen-printed. The carrier 36 is sufficiently rigid to allow for screen-printing on a lower surface of the oxide layer 48.

Figure 7:
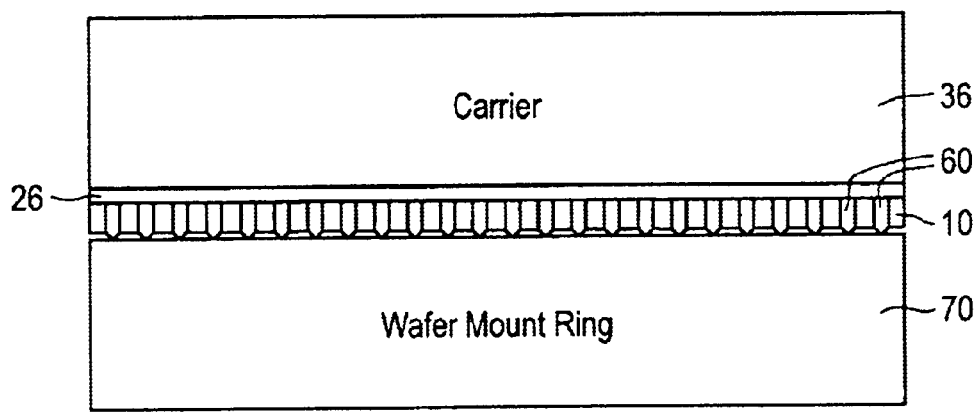
FIG. 7 is a view similar to FIG. 6 after conductive members are formed in all of the openings and a lower surface of the wafer is mounted to a wafer mount ring.

As illustrated in FIG. 7, a lower surface of the wafer substrate 10 is subsequently mounted to a wafer mount ring 70. Adhesive tape is typically used on an upper surface of the wafer mount ring 70, to which the wafer substrate 10 adheres.

Figure 8:
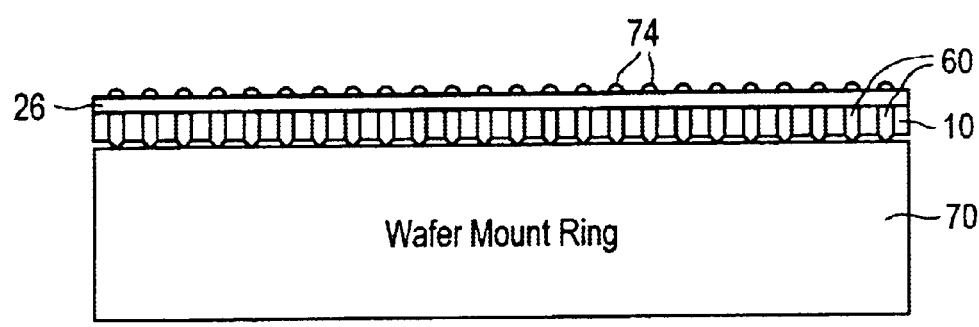
FIG. 8 is a view similar to FIG. 7 after the carrier is removed.

The carrier 36 is subsequently removed from the integrated circuit 26, as illustrated in FIG. 8. The wafer mount ring 70 is sufficiently rigid to prevent breaking of the wafer substrate 10. Bumps 74 may then be screen-printed or plated on each one of the contacts pads 32 illustrated in FIG. 6.

The wafer substrate 10 is subsequently singulated into individual dies. Each die is then removed from the wafer mount ring 70. FIG. 6 illustrates a partially assembled electronic assembly 172, including one such die 110. The electronic assembly 172 also includes another die 210 and a package substrate 300. The die 210 may be manufactured in exactly the same way as the die 110. It may also be possible that the dies 110 and 210 are exactly the same in all respects, and may even be from the same wafer substrate. The dies 110 and 210 may, for example, be identical memory dies. Alternatively, the dies 110 and 210 may differ from one another and may even come from different manufacturers. One die may, for example, be a processor, and the other die a memory die. What should be noted is that the die 110 also includes bumps 274 and 260 at the top and the bottom, respectively. The bumps at the top may not be necessary, and merely assist in alignment during subsequent reflow. When the die 110 is stacked on the die 210, and a respective one of the bumps 66 is positioned on a respective one of the bumps 274. The package substrate 300 has a plurality of contact terminals 310 on an upper surface thereof. Each one of the bumps 260 is positioned on a respective one of the contact terminals 310.

Figure 9:
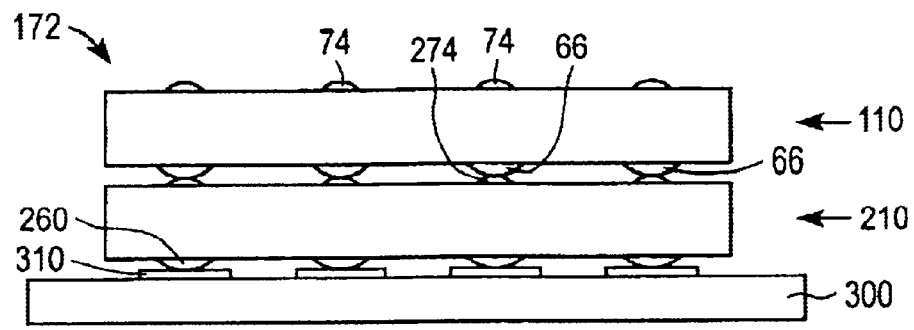
FIG. 9 is a side view of a partially fabricated electronic assembly according to an embodiment of the invention, wherein a die singulated from the wafer substrate shown in FIG. 8, another die, and a package substrate are stacked on one another.
Figure 10:
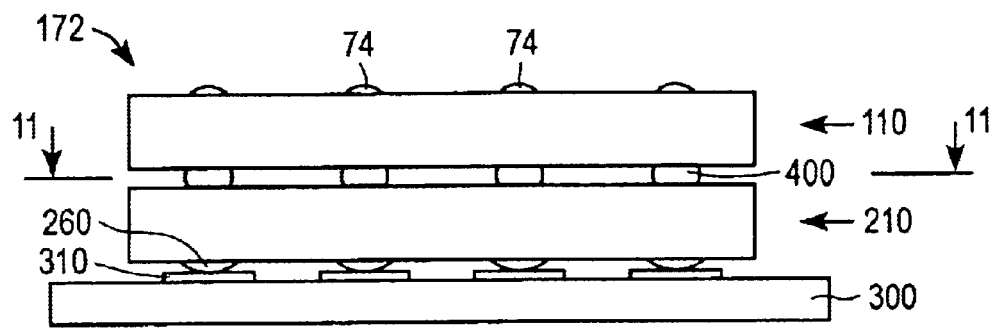
FIG. 10 is a view similar to FIG. 9 after heating and cooling of the electronic assembly.

FIG. 10 illustrates the electronic assembly 172 of FIG. 9 after being processed through a reflow furnace. The electronic assembly 172 is heated so that the bumps 66, 274, and 260 melt, and are subsequently cooled. The bumps 66 thereby attach to the bumps 274 to form interconnects 400. The interconnects 400 structurally attach the die 110 to the die 210. The interconnects 400 also electrically connect the integrated circuit of the die 110 with the integrated circuit of the die 210. The bumps 260 attach the die 210 to the package substrate 300 and interconnect the integrated circuit of the die 210 with metallization layers 30 in the package substrate 300.

Figure 11:
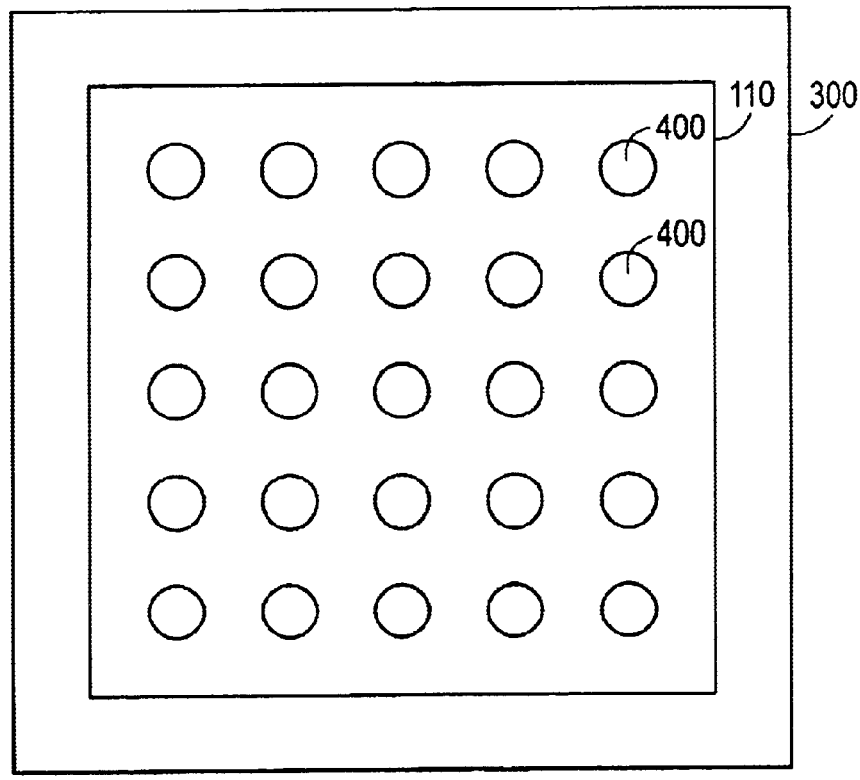
FIG. 11 is a cross-sectional plan view on 11—11 in FIG. 10.

As illustrated in FIG. 11, the interconnects 400 are in an array of rows and columns. A typical array may, for example, have ten rows and eight columns. Although only the interconnects 400 are shown in FIG. 11, it will be understood that an array of conductive members such as the conductive members 60 shown in FIG. 6 are formed in an array which corresponds to the array of the interconnects 400.

One advantage is that the openings 16 are initially fabricated in an upper surface of a wafer substrate, which allows for the use of alignment features on the upper surface of the wafer substrate. A further advantage is that the plugs do not take up "real estate" reserved for metal layers of the integrated circuit. Yet a further advantage is that a metal redistribution layer can be formed on a lower surface of the wafer substrate, because the carrier provides sufficient rigidity.

An additional benefit of the electronic assembly 172 is that the die 110 provides the structural interconnection benefits of a flip-chip die, while providing the thermal benefits of a wire-bonded die. Because the integrated circuit is at the top, it can be more easily cooled with a heat sink closer to the active circuitry than in a conventional flip-chip application. However, because the die 110 is structurally and electrically connected through an array of bumps 66, the structural and electrical benefits of a flip-chip application are achieved. A further advantage of having conductive members on vias in the silicon below the integrated circuit is that they are more thermally conductive than the silicon and assist in dissipation of heat.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:

1. A method of constructing art electronic assembly, comprising:
   forming a plurality of plugs in a first substrate;
   manufacturing a first integrated circuit on a first side of the first substrate, the first substrate and the first integrated circuit jointly forming a first die;
   removing the plugs to leave a plurality of openings in the first substrate;
   forming a seed layer in each opening and as a contact on a second side of the first substrate opposing the first side;
   plating a plurality of conductive members, each conductive member having a respective portion being plated on a portion of the seed layer in the respective opening to form a via in each respective opening and being plated on a contact of the respective seed layer on the second side of the first substrate to form a bump on each respective contact and standing proud of the substrate; and
   locating the first die on a second component having a circuit, the first integrated circuit being connected through the material of the bump and the via of each conductive members to the circuit of the second component.

2. The method of claim 1, wherein the plugs are formed in a first surface of the first substrate and the first integrated circuit is manufactured on the first surface.

3. The method of claim 2, further comprising:
   removing a sacrificial portion of the first substrate opposing the first surface to leave the first substrate with a second surface opposing the first surface, the plugs being exposed by said removal and being removed through the second surface.

4. The method of claim 3, further comprising:
   bonding a side of the first die opposing the sacrificial portion that is removed to a carrier, the sacrificial portion being removed while the first die is bonded to the carrier.

5. The method of claim 4, wherein at least some of the sacrificial portion is removed in a grinding operation.

6. The method of claim 5, wherein some of the sacrificial portion is etched away.

7. The method of claim 3, further comprising:
   mounting the first die to a mount structure with the first die between the mount structure and the carrier; and
   removing the carrier from the die after the die is mounted to the mount structure.

8. The method of claim 7, wherein the first die is part of a processed wafer, further comprising:
   singulating the first die from the wafer substrate after the carrier is removed.

9. The method of claim 8, further comprising:
   removing the die from the mount structure after the first die is singulated from the wafer.

10. The method of claim 1, wherein the conductive members are plated in the openings.

11. The method of claim 10, further comprising:
    depositing an oxide layer in each opening, the conductive members being formed over the oxide layers.

12. The method of claim 11,
    wherein the seed layer is deposited on each oxide layer.

13. The method of claim 1, wherein the second component has a second substrate and the circuit of the second component is a second integrated circuit formed on the second substrate.

14. The method of claim 13, further comprising:
    forming a plurality of plugs in the second substrate;
    removing the plugs from the second substrate; and
    forming a conductive member in each opening in the second substrate.

15. The method of claim 1, wherein the conductive members are in at least a 3×3 array.

16. The method of claim 1, wherein each conductive member is located on a respective terminal of the second die.

17. The method of claim 1, wherein at least metallization layers of the first integrated circuit are manufactured after the plugs are formed.

18. The method of claim 17, wherein the plugs are removed after at least transistors of the first integrated circuit are manufactured.

19. A method of constructing an electronic assembly, comprising:
    forming a plurality of plugs in a first surface of a first substrate;
    manufacturing a first integrated circuit on the first surface of the first substrate, the first substrate and the first integrated circuit jointly forming a first die;
    removing a sacrificial portion of the first substrate opposing the first surface to leave the first substrate with a second surface opposing the first surface exposed by said removal;
    removing the plugs through the second surface to leave a plurality of openings in the first substrate;
    forming a conductive member in each opening; and
    locating the first die on a second component having a circuit, the first integrated circuit being connected through the conductive members to the circuit of the second component.

20. The method of claim 19, further comprising:
    bonding a side of the first die opposing the sacrificial portion that is removed to a carrier, the sacrificial portion being removed while the first die is bonded to the carrier.

21. The method of claim 20, wherein at least some of the sacrificial portion is removed in a grinding operation.

22. The method of claim 21, wherein some of the sacrificial portion is etched away.

23. The method of claim 19, further comprising:
    mounting the first die to a mount structure with the first die between the mount structure and the carrier; and
    removing the carrier from the die after the die is mounted to the mount structure.

24. The method of claim 23, wherein the first die is part of a processed wafer, further comprising:
    singulating the first die from the wafer substrate after the carrier is removed.

25. The method of claim 24, further comprising:
    removing the die from the mount structure after the first die is singulated from the wafer.

26. The method of claim 19, wherein the conductive members are plated in the openings.

27. The method of claim 26, further comprising:
depositing an oxide layer in each opening, the conductive members being formed over the oxide layers.

28. The method of claim 27, further comprising:
depositing a metal layer on each oxide layer, the conductive members being plated on the metal layer.

29. The method of claim 19, wherein the second component has a second substrate and the circuit of the second component is a second integrated circuit formed on the second substrate.

30. The method of claim 29, further comprising:
forming a plurality of plugs in the second substrate;
removing the plugs from the second substrate; and
forming a conductive member in each opening in the second substrate.

31. The method of claim 19, wherein the conductive members are in at least a 3×3 array.

32. The method of claim 19, wherein each conductive member is located on a respective terminal of the second die.

33. The method of claim 32, wherein at least metallization layers of the first integrated circuit are manufactured after the plugs are formed.

34. The method of claim 32, wherein the plugs are removed after at least transistors of the first integrated circuit are manufactured.

* * * * *